(12) United States Patent
Chang et al.

(10) Patent No.: US 7,115,911 B2
(45) Date of Patent: Oct. 3, 2006

(54) LED MODULE AND METHOD OF PACKAGING THE SAME

(75) Inventors: Chih-Chin Chang, Hsin-Chu (TW); Teng-Huei Huang, Hsin-Chu Hsien (TW); Chien-Lung Lee, Nan-Tou Hsien (TW)

(73) Assignee: Lighthouse Technology Co., LTD, Hsin-Chu Hsien (TW)

( * ) Notice: Subject to any disclaimer, the term of this patent is extended or adjusted under 35 U.S.C. 154(b) by 0 days.

(21) Appl. No.: 10/906,573

(22) Filed: Feb. 24, 2005

(65) Prior Publication Data
US 2006/0091403 A1   May 4, 2006

(30) Foreign Application Priority Data
Oct. 29, 2004   (TW) ............................. 93132981 A

(51) Int. Cl.
*H01L 27/15*   (2006.01)

(52) U.S. Cl. ................. 257/81; 257/100; 257/E25.019; 257/E25.028; 257/E25.032

(58) Field of Classification Search ................. 438/25, 438/106, 107, 110, 112, 124, 126–127; 257/79–82, 257/98, 99, 100, 622, 623, 625, 678, 687, 257/701, E33.006, E33.07, 13, E25.019, 257/E25.028, E25.032
See application file for complete search history.

(56) References Cited

U.S. PATENT DOCUMENTS

| 4,622,433 A | * | 11/1986 | Frampton ................. 174/52.4 |
| 6,746,295 B1 | * | 6/2004 | Sorg ............................ 445/24 |
| 2004/0099874 A1 | | 5/2004 | Chang et al. |
| 2004/0173808 A1 | * | 9/2004 | Wu ............................. 257/99 |

FOREIGN PATENT DOCUMENTS

| TW | 549603 | 8/2003 |
| TW | 578280 | 3/2004 |
| TW | 582122 | 4/2004 |

* cited by examiner

*Primary Examiner*—Brook Kebede
(74) *Attorney, Agent, or Firm*—Winston Hsu

(57) ABSTRACT

An LED module and method of packing the same are provided. The LED module includes a substrate with at least one cavity therein, at least one LED unit positioned on portions of the substrate in the cavity, a circuit positioned above the LED unit and electrically connected to the LED unit, and a first capsulation material filling within the cavity.

20 Claims, 5 Drawing Sheets

LED MODULE AND METHOD OF PACKAGING THE SAME

BACKGROUND OF INVENTION

1. Field of the Invention

The present invention relates to a light emitting diode (LED) module and method of packaging the same, and more particularly, to a high power LED module and method for packaging the same.

2. Description of the Prior Art

In recent years, a new application field of high illumination light emitting diodes (LEDs) has been developed. Different from a common incandescent light, a cold illumination LED has the advantages of low power consumption, long device lifetime, no idling time, and quick response speed. In addition, since the LED also has the advantages of small size, vibration resistance, suitability for mass production, and ease of fabrication as a tiny device or an array device, it has been widely applied in display apparatus and indicating lamps used in information, communication, and consumer electronic products. The LEDs are not only utilized in outdoor traffic signal lamps or various outdoor displays, but are also very important components in the automotive industry. Furthermore, the LEDs work well in portable products, such as cellular phones and as backlights of personal data assistants. These LEDs have become necessary key components in the highly popular liquid crystal displays because they are the best choice when selecting the light source of the backlight module.

Please refer to FIG. 1. FIG. 1 is a cross section diagram showing a conventional LED module. As shown in FIG. 1, the conventional LED module includes a substrate 10, a plurality of LED units 12 positioned above the substrate 10, and a capsulation material layer 14 disposed on the LED unit 12, in which each LED unit 12 includes an LED chip 16, an electrical conductive layer 18 positioned below the LED chip 16, and at least one wire 20 used for connecting the LED chip 16 to the electrical conductive layer 18.

In real applications, the substrate 10 can be a lead frame or a printed circuit board, and the LED chip 16 is fixed onto a positive electrode terminal of the electrical conductive layer 18 via a fixing gel. The positive and negative electrodes on the LED chip 16 are then connected separately to the positive electrode terminal and the negative electrode terminal defined on the electrical conductive layer 18, using a wire bonding technique. The capsulation material layer 14 is composed of mixtures containing resin, wavelength converting materials, fluorescent powder, and/or light-diffusing materials. Next, the capsulation material layer 14 is packaged onto the substrate 10 by a molding or sealant injection method.

According to the conventional method, the package process of the LED unit 12 is performed after the wire bonding and the LED unit 12 is fixed onto the substrate 10. Essentially, a defective LED chip or a poor wire bonding process will result in a nonfunctional LED module, which will also affect the overall reliability and cost of the final product. In order to protect the LED chip and wire, the capsulation material layer 14 is composed primarily of robust and enduring materials. Hence, as the capsulation material layer 14 gets more rigid, the stress level of the overall package structure will increase accordingly, which will easily cause the capsulation material layer 14 to break in half or detach from the substrate 10 and decrease the reliability of the product.

Please refer to FIG. 2. FIG. 2 is a cross-sectional diagram showing a conventional LED module containing a single LED package. As shown in FIG. 2, the LED module includes a substrate 30, an insulating layer 32, a printed circuit board 34 positioned above the substrate 30, and a plurality of LED package bodies 36 disposed on the printed circuit board 34 and electrically connected to the printed circuit board 34. Each LED package body 36 includes an LED chip 40 positioned on the electrical conductive layer 38a, which is used as a positive electrode terminal. The positive electrode and the negative electrode of the LED chip 40 are separately connected to the corresponding positive electrode terminal defined on the electrical conductive layer 38a via a wire 42a and the corresponding negative electrode terminal defined on the electrical conductive layer 38b via a wire 42b. The LED package body 36 also includes a capsulation material layer 44 disposed on the devices including the LED chip 40, the wires 42a and 42b, and the electrical conductive layers 38a and 38b.

After the construction of the LED package body 36 is completed by forming the capsulation material layer 44 via molding or sealant injection, the entire LED module is then formed by aggregating each of the components including the LED package body 36 on the substrate 30. In a high power LED module, the electrical conductive layer 38a that carries the LED chip 40 has to be designed with a larger volume and has to be made of heat radiating materials to prevent the LED chip 40 from overheating, which may eventually result in a reduction of light intensity or failure of the entire device. In addition to the fact that the volume of the single LED package body 36 is significantly larger than the conventional multiple LED linking package structure, the heat radiating demand required by most high power LED modules adds an extra burden and limitation to the design of the LED module.

In addition, several single LED package structures and methods applicable to high power LED modules have also been disclosed in Taiwan Patent No. 578280 and No. 582122. Taiwan Patent No. 549603, on the other hand, discloses a multiple LED linking package structure. Despite the fact that the LED module formed by the single LED package method is able to effectively reduce the risk of the LED module suffering from conditions such as defective single LED chip or poor wire bonding, numerous uncertainties including higher cost, and unstable heat radiating ability and structure strength still remain unsolved, preventing the single LED chip from being popularized in other product applications.

SUMMARY OF INVENTION

It is therefore an objective of the present invention to provide an LED module and method of packaging the same for reducing the volume of the LED module and being applicable to high power LED modules.

It is another objective of the present invention to provide an LED module and method of packaging the same, in which the method involves providing packaging processes and testing for a single LED chip to increase the overall reliability and life expectancy of the LED module.

It is another objective of the present invention to provide an LED module and method for packaging the same, which is capable of changing the quantity of the LED chip according to the product designs, so as to increase the application flexibility of the product.

According to the preferred embodiment of the present invention, a light emitting diode (LED) module includes a substrate, and the substrate further includes at least one cavity. At least one LED unit is disposed on portions of the substrate in the cavity. A circuit is positioned above the LED and electrically connected to the LED. A first capsulation material layer is filled within the cavity.

Since the circuit (or printed circuit board) is situated above the LED unit, the radiating ability of the space under the LED unit can be readily increased, which will also facilitate the control and power supply located above the circuit. In addition, the circuit can be adjusted according to the size, quantity, and arrangement of the LED unit for increasing the application flexibility of the LED module. Due to the fact that the LED unit of the present invention is a small size module, which can be packaged and tested beforehand, the present invention is able to reduce the volume of the LED module and improve its reliability and life expectancy.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
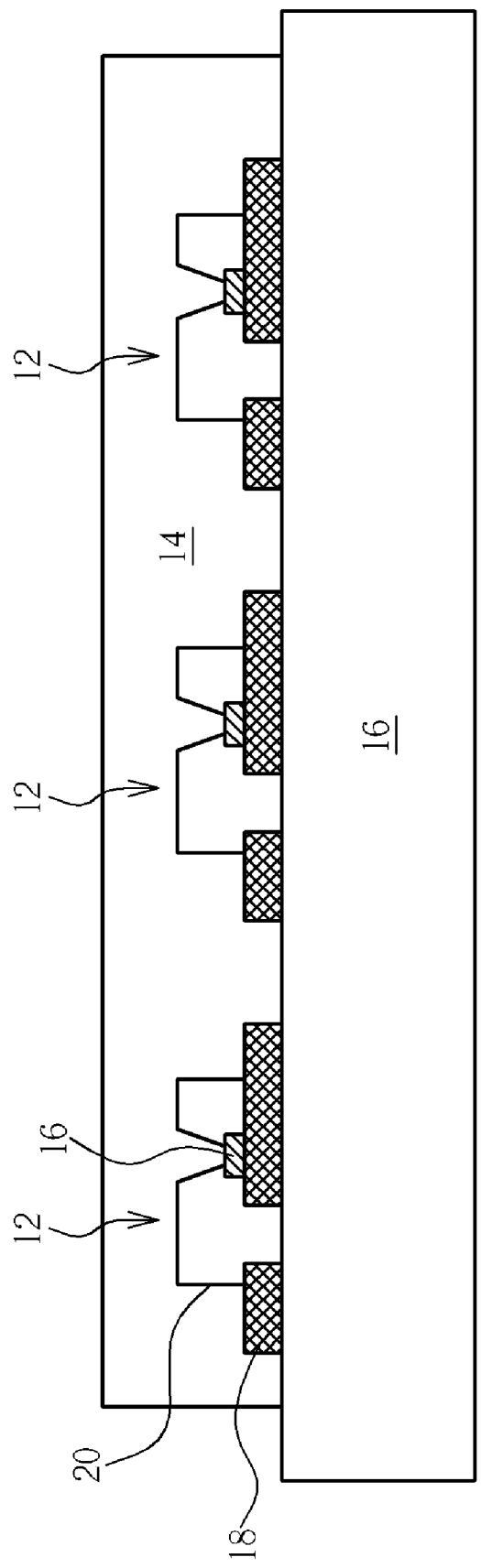
FIG. 1 is a cross-sectional diagram showing a conventional LED module containing multiple linking LED packages.
Figure 2:
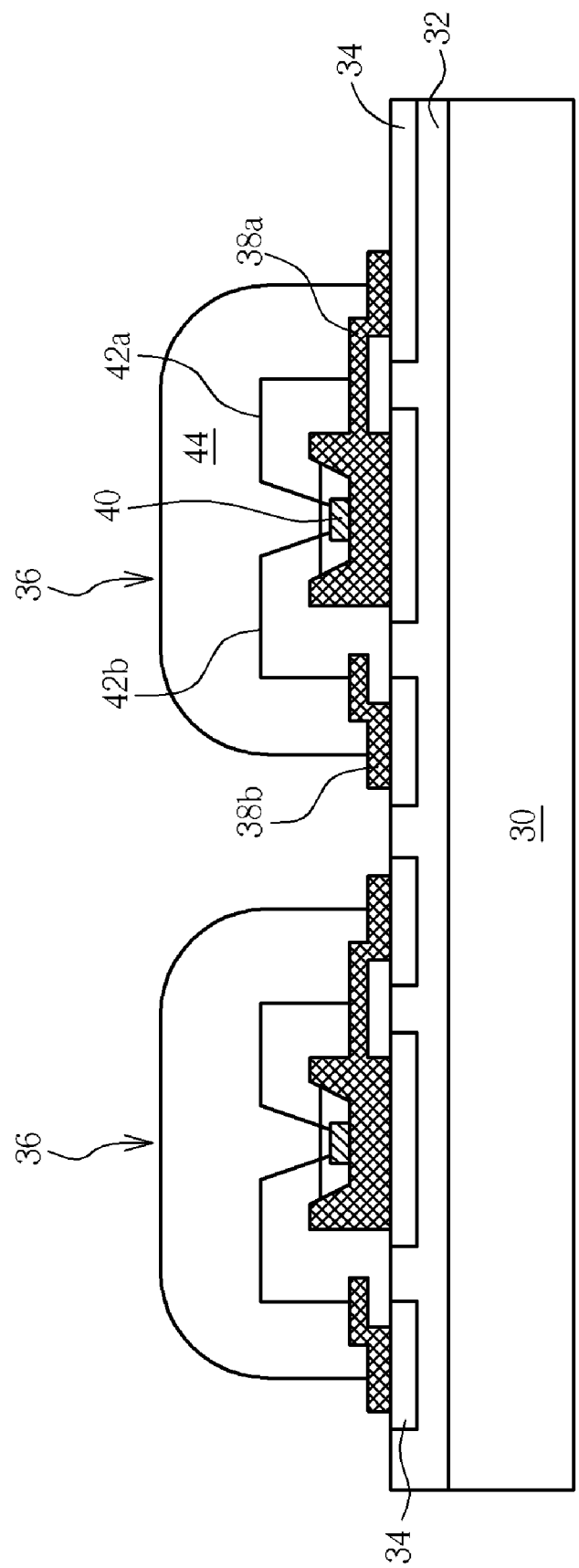
FIG. 2 is a cross-sectional diagram showing a conventional LED module containing a single LED package.
Figure 3:
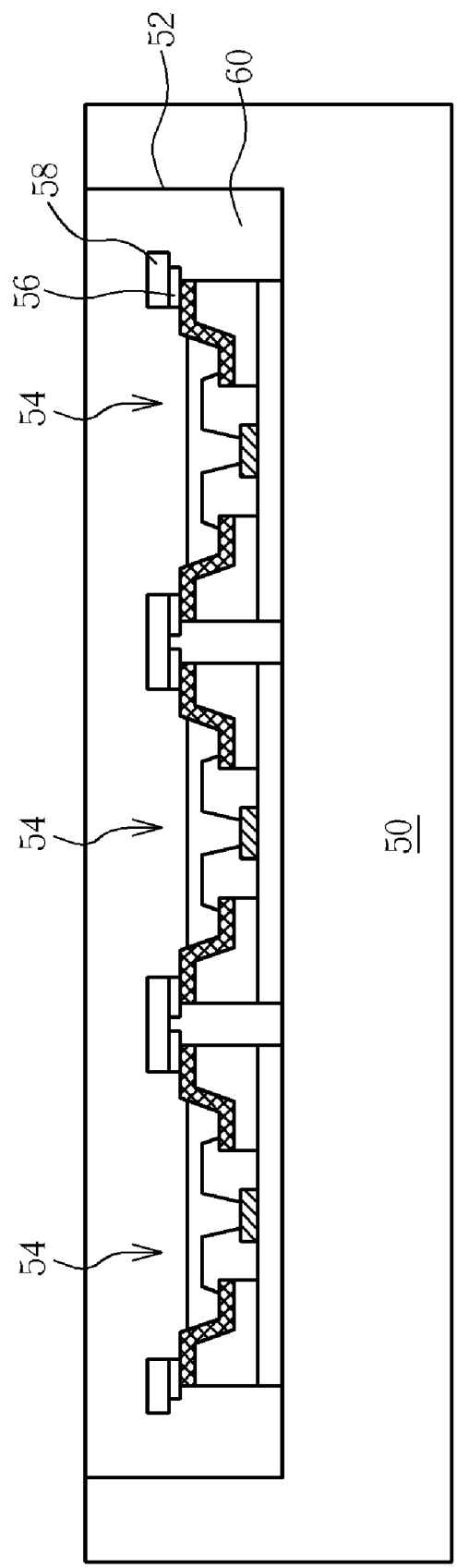
FIG. 3 is a perspective diagram showing the package of an LED module according to the present invention.

Please refer to FIG. 3. FIG. 3 is a perspective diagram showing the package of an LED module according to the present invention. As shown in FIG. 3, an LED module includes a substrate 50, in which the substrate 50 includes at least one cavity 52, at least one LED unit 54 positioned on portions of the substrate 50 in the cavity 52, a circuit 58 soldered to a solder pad 56 above the LED unit 54 and electrically connected to the LED unit 54, and a capsulation material layer 60 filled within the cavity 52.

According to the preferred embodiment of the present invention, the substrate 50 is a radiating substrate, such that one side of the substrate 50 is used for containing the cavity 52 of the LED unit 54, whereas the other side of the substrate 50 without the cavity 52 is used for forming radiating devices including radiating fins, radiating pipes, or active cooling devices. Alternatively, a radiating gel can also be used to fix the substrate 50 to a radiating device. The circuit 58 can be a printed circuit board or other circuit designs, and the circuit 58 can be adjusted according to the size, quantity, and arrangement of the LED unit 54, such that the circuit 58 may include a plurality of openings corresponding to the LED unit 54 to prevent the illuminating and radiating efficiency of the LED 54 from being influenced. In addition, the capsulation material layer 60 is made of robust, durable, and light-penetrating materials, such as epoxy, spin-on glass (SOG), polyimide, B-staged bisbenzocyclobutene, ceramics, or glass, in that the materials can be utilized for forming a single material layer or a composite material layer. Moreover, the capsulation material layer 60 can be mixed with other materials including wavelength converting materials, fluorescent powder, or light-diffusing materials and then packaged by a molding, sealant injection, or sintering process. Taking the LED module that illuminates white light beams as an example, fluorescent powder such as YAO ($Y_3Al_5O_{12}$) is often used as a wavelength converting material for converting a light source (such as blue light beams) from one wavelength to another wavelength (such as yellow light beams). The yellow light beams are then mixed with partially penetrating blue light beams to produce white light beams. Alternatively, red light beams can also be used to mix with blue and green light beams for producing the white light beams.

Figure 4:
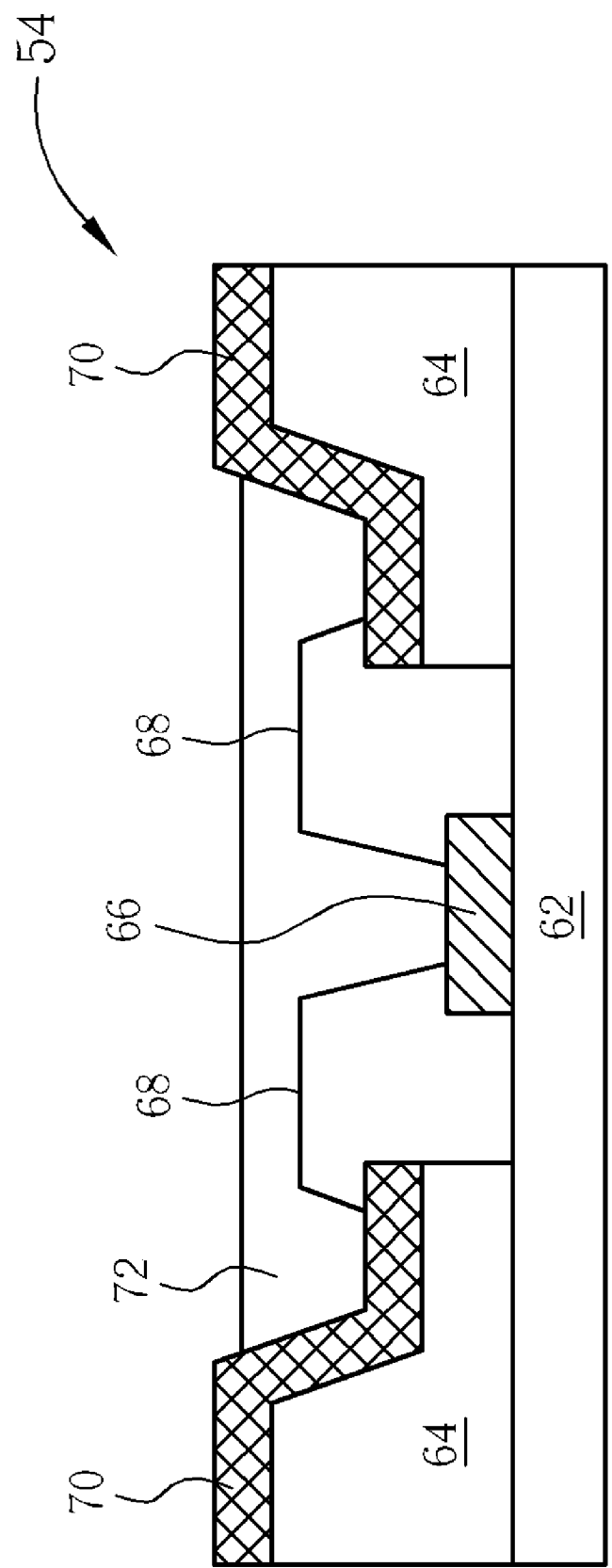
FIG. 4 is an enlargement view showing an LED unit of the LED module from FIG. 3.
Figure 5:
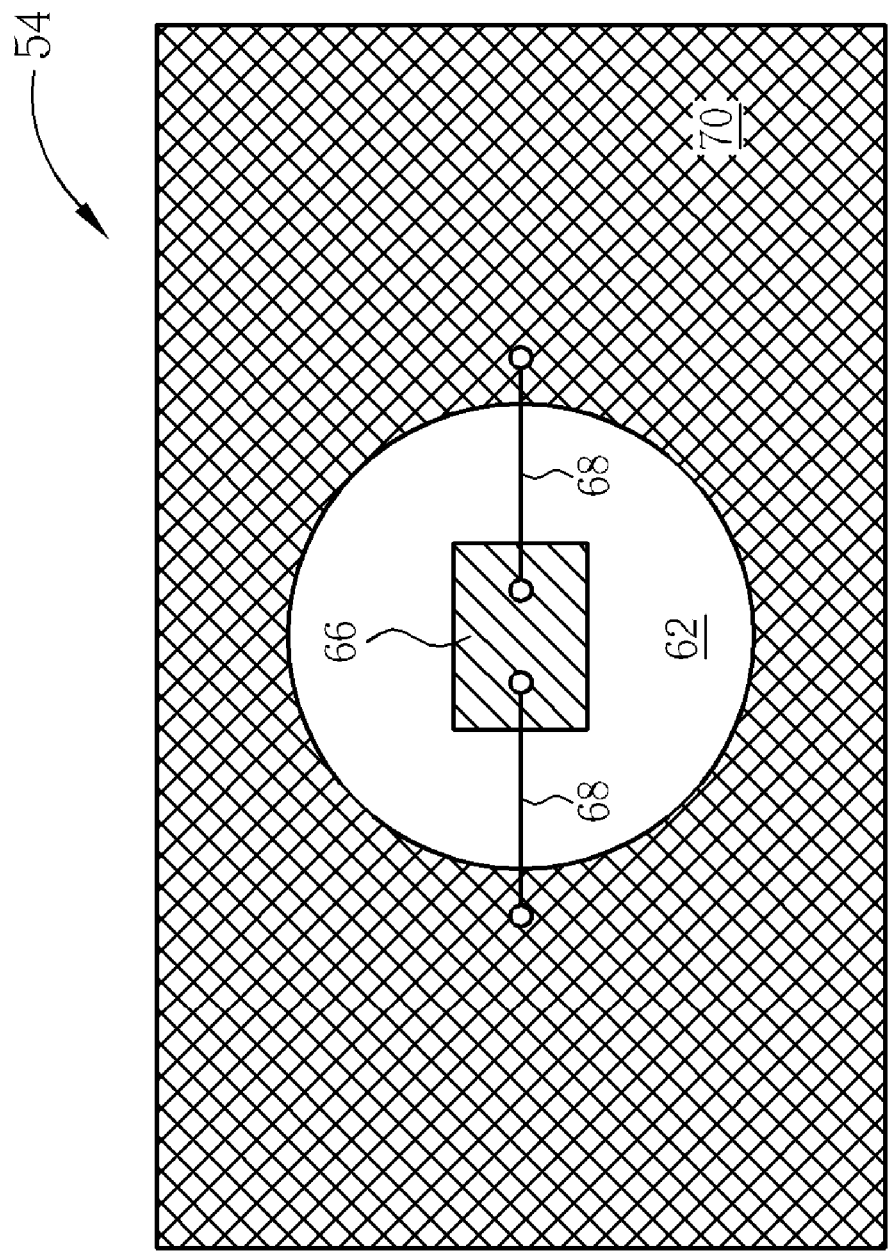
FIG. 5 is a top view diagram showing an LED unit of the LED module from FIG. 3.

Please refer to FIG. 4 and FIG. 5. FIG. 4 is an enlargement view showing the LED unit 54 of FIG. 3 whereas FIG. 5 is a top view diagram showing the LED unit 54. As shown in FIG. 4 and FIG. 5, the LED unit 54 includes a thermal conductive layer 62, an LED chip 66 disposed on the thermal conductive layer 62, an insulating layer 64, an electrical conductive layer 70 positioned above the thermal conductive layer 62 and surrounding the LED chip 66, at least one wire connecting the LED chip 66 to the electrical conductive layer 70, and a capsulation material layer 72 disposed on the wire 68 and the LED chip 66.

According to the present invention, the LED chip 66 is glued on the thermal conductive layer 62, hence the heat can be expelled out from the bottom of the thermal conductive layer 62. Preferably, the thermal conductive layer 62 is made of heat radiating materials such as thin metal plates, and the structure of the thermal conductive layer 62 can also be redesigned to facilitate heat radiation, e.g. including radiating structures like radiating fins or radiating pipes. A positive electrode terminal and a negative electrode terminal are also defined on the electrical conductive layer 70, and the terminals are separately connected to the corresponding positive electrode and negative electrode on the LED chip 66 through the wire 68. In addition, the capsulation material layer 72 is made of low stress and light-penetrating materials such as silicon glue, glass, ceramic materials, or mixture of these materials, and silicon glue is preferred. The surface of the capsulation material layer 72 is at the same level or lower than the top surface of the electrical conductive layer 70 for performing the testing and packaging of the LED unit 54 later in the process.

By fabricating the LED chip 66 into the LED unit 54 that is more susceptible to electrical and optical testing, the present invention is able to remove the defective LED unit during mass production processes before assembling the LED unit 54 and the substrate 50, soldering the wire 58, and filling the capsulation material layer 60. In addition, the present invention performs a first packaging process to form the capsulation material layer 72 with low-stress and non-fragile characteristics over the LED chip 66, and then perform a second packaging process to form the capsulation material layer 60 with robust and durable characteristics over the LED unit 54 for increasing the reliability and life expectancy of the LED module. Moreover, the quantity of the LED unit 54 can be adjusted accordingly. By altering the connection of the wires 58 and the size of the cavity 52, the present invention can also be easily utilized in various light apparatuses including normal lightings, back light module of an LCD, automobile lightings, and decorating lightings.

In contrast to the conventional LED module, the present invention is able to enhance the heat radiating ability particularly at the bottom area of the LED chip by disposing the circuit (printed circuit board) on top of the LED unit. By using the proposed design, the circuit can be easily adjusted according to the size, quantity, and arrangement method of the LED unit for increasing the flexibility of LED module applications. Due to the fact that the LED unit of the present invention is a small size module, which can be packaged and tested beforehand, the present invention is able to reduce the volume of the LED module and improve its reliability and life expectancy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting diode (LED) module, comprising:
   a substrate, the substrate comprising at least one cavity;
   at least one LED unit disposed on portions of the substrate in the cavity, wherein the LED unit comprises an LED chip, a thermal conductive layer disposed below the LED chip, an electrical conductive layer electrically connected to the LED chip, and an insulating layer positioned between the electrical conductive layer and the thermal conductive layer;
   a circuit positioned above the LED unit and electrically connected to the LED unit; and
   a first capsulation material layer filled within the cavity.

2. The LED module of claim 1, wherein the LED unit further comprises at least one wire for connecting the LED chip to the electrical conductive layer.

3. The LED module of claim 1, wherein the LED unit further comprises a second capsulation material layer covering the LED chip.

4. The LED module of claim 3, wherein the second capsulation material layer is selected from the group consisting of a silica gel layer, a glass layer, a ceramic layer, or a composite layer comprised of silica gel, glass, or ceramics.

5. The LED module of claim 3, wherein the surface of the second capsulation material layer is at the same level as the top surface of the electrical conductive layer.

6. The LED module of claim 1, wherein the circuit comprises an opening for exposing the LED chip.

7. The LED module of claim 1, wherein the circuit comprises a printed circuit board or other circuit designs.

8. The LED module of claim 1, wherein the substrate comprises a radiating substrate.

9. The LED module of claim 1, wherein the substrate is selected from the group consisting of a radiating fin, a radiating pipe, or an active cooling device.

10. The LED module of claim 1, wherein the first capsulation material layer is selected from the group consisting of epoxy, spin-on glass (SOG), polyimide, B-staged bisbenzocyclobutene, ceramics, and glass.

11. A packaging method of an LED module, comprising:
    providing a substrate, the substrate comprising at least one cavity;
    disposing at feast one LED unit on portions of the substrate in the cavity, wherein the LED unit comprises an LED chip, a thermal conductive layer disposed below the LED chip, an electrical conductive layer electrically connected to the LED chip, and an insulating layer positioned between the electrical conductive layer and the thermal conductive layer;
    soldering a circuit above the LED unit; and
    tilling a first capsulation material layer within the cavity.

12. The packaging method of claim 11, wherein the LED unit further comprises at least one wire for connecting the LED chip to the electrical conductive layer.

13. The packaging method of claim 11, wherein the LED unit further comprises a second capsulation material layer covering the LED chip.

14. The packaging method of claim 13, wherein the second capsulation material layer is selected from the group consisting of a silica gel layer, a glass layer, a ceramic layer, or a composite layer comprised of silica gel, glass, or ceramics.

15. The packaging method of claim 13, wherein the surface of the second capsulation material layer is even with the top surface of the electrical conductive layer.

16. The packaging method of claim 11, wherein the circuit comprises an opening for exposing the LED chip.

17. The packaging method of claim 11, wherein the circuit comprises a printed circuit board or other circuit designs.

18. The packaging method of claim 11, wherein the substrate comprises a radiating substrate.

19. The packaging method of claim 11, wherein the substrate is selected from the group consisting of a radiating fin, a radiating pipe, or an active cooling device.

20. The packaging method of claim 11, wherein the first capsulation material layer is selected from the group consisting of epoxy, spin-on glass (SOG), polyimide, B-staged bisbenzocyclobutene, ceramics, and glass.

* * * * *